United States Patent
Fu et al.

(10) Patent No.: US 11,506,352 B2
(45) Date of Patent: *Nov. 22, 2022

(54) LIGHT-EMITTING MODULE FOR VEHICLE LAMP

(71) Applicants: LITE-ON ELECTRONICS (GUANGZHOU) LIMITED, Guangzhou (CN); Lite-On Technology Corporation, Taipei (TW)

(72) Inventors: Ching-Tang Fu, Taoyuan (TW); Chia-Jung Tsai, Kaohsiung (TW); Han-Ming Lee, Hsinchu (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/031,937

(22) Filed: Sep. 25, 2020

(65) Prior Publication Data

US 2021/0010652 A1 Jan. 14, 2021

Related U.S. Application Data

(63) Continuation of application No. 16/571,187, filed on Sep. 15, 2019, now Pat. No. 10,823,355, which is a
(Continued)

(30) Foreign Application Priority Data

Jan. 27, 2016 (TW) .................. 105201227

(51) Int. Cl.
*H05K 1/11* (2006.01)
*H05K 1/18* (2006.01)
(Continued)

(52) U.S. Cl.
CPC .......... *F21S 41/192* (2018.01); *F21S 41/151* (2018.01); *H01L 33/62* (2013.01); *H05K 1/111* (2013.01);
(Continued)

(58) Field of Classification Search
CPC ... H05K 1/11; H05K 1/18; H05K 1/34; H05K 1/181; H05K 3/30; H05K 3/34;
(Continued)

(56) References Cited

U.S. PATENT DOCUMENTS 4,314,870 A * 2/1982 Ishida .................. H01L 24/743
156/272.2
5,234,530 A * 8/1993 Freeman, III ........... H01L 24/83
156/364

(Continued)

*Primary Examiner* — Xiaoliang Chen
(74) *Attorney, Agent, or Firm* — JCIPRNET

(57) ABSTRACT

Disclosed is a light-emitting module, comprising: a circuit board, a conductive layer, a light-emitting device, and an adhesive material. The circuit board comprises a device-attachment area, the conductive layer being disposed on the device-attachment area, the light-emitting device being disposed on the conductive layer and electrically connected to the circuit board through the conductive layer, and the adhesive layer being used for connecting the light-emitting device to the circuit board, wherein a curing temperature of the adhesive layer is lower than a melting point of the conductive layer. Adopting the aforementioned technical means, the degree of offset in the position of the light-emitting device after reflow soldering can be greatly reduced. In addition, a vehicle lamp device using the light-emitting module is also provided.

9 Claims, 6 Drawing Sheets

Related U.S. Application Data continuation-in-part of application No. 15/175,113, filed on Jun. 7, 2016, now abandoned.

(51) Int. Cl.

| | | |
|---|---|---|
| *H05K 3/30* | (2006.01) | |
| *H05K 3/34* | (2006.01) | |
| *H01L 21/00* | (2006.01) | |
| *H01L 21/50* | (2006.01) | |
| *H01L 21/58* | (2006.01) | |
| *H01L 21/60* | (2006.01) | |
| *H01L 21/48* | (2006.01) | |
| *F21S 41/19* | (2018.01) | |
| *H01L 33/62* | (2010.01) | |
| *F21S 41/151* | (2018.01) | |
| *F21Y 115/10* | (2016.01) | |
| *F21Y 103/10* | (2016.01) | |

(52) U.S. Cl.
 CPC ........... *H05K 1/181* (2013.01); *H05K 3/3431* (2013.01); *F21Y 2103/10* (2016.08); *F21Y 2115/10* (2016.08); *H01L 2933/0066* (2013.01); *H05K 2201/10106* (2013.01); *H05K 2203/166* (2013.01)

(58) Field of Classification Search
 CPC ......... H05K 3/305; H01L 21/00; H01L 21/50; H01L 21/58; H01L 21/60; H01L 23/48; H01L 23/488
 USPC ........... 174/260; 361/767; 257/98, 737, 779, 257/782; 228/175; 156/272.2, 356, 358
 See application file for complete search history.

(56) References Cited

U.S. PATENT DOCUMENTS

| | | | | |
|---|---|---|---|---|
| 5,935,375 A | * | 8/1999 | Nakazawa | B05C 5/0208 156/356 |
| 6,262,513 B1 | * | 7/2001 | Furukawa | H03H 9/6469 310/313 R |
| 6,486,543 B1 | * | 11/2002 | Sano | H01L 23/3107 257/684 |
| 8,557,630 B2 | * | 10/2013 | Sakemi | H01L 23/49883 257/737 |
| 2001/0000754 A1 | * | 5/2001 | Nakazawa | B05C 5/001 438/106 |
| 2004/0124007 A1 | * | 7/2004 | Ashida | H05K 3/3436 174/260 |
| 2006/0163749 A1 | * | 7/2006 | Lee | H01L 21/563 257/E21.503 |
| 2007/0080438 A1 | * | 4/2007 | Yamanaka | H01L 23/5386 257/676 |
| 2007/0181252 A1 | * | 8/2007 | Bohm | C09J 5/06 156/297 |
| 2008/0308930 A1 | * | 12/2008 | Yoshida | H01L 24/28 257/737 |
| 2009/0310921 A1 | * | 12/2009 | Kurita | G02B 6/4239 385/88 |
| 2011/0024786 A1 | * | 2/2011 | Sugiyama | H01L 24/97 257/99 |
| 2011/0108997 A1 | * | 5/2011 | Ohashi | H01L 24/83 257/782 |
| 2011/0244165 A1 | * | 10/2011 | Hill | B32B 37/12 428/66.6 |
| 2012/0052633 A1 | * | 3/2012 | Sakemi | H05K 3/305 438/118 |
| 2012/0056280 A1 | * | 3/2012 | Wu | G01P 15/18 257/415 |
| 2012/0188298 A1 | * | 7/2012 | Matsumoto | B41J 2/14209 347/6 |
| 2012/0299202 A1 | * | 11/2012 | Yamaguchi | H05K 3/305 257/779 |
| 2013/0001633 A1 | * | 1/2013 | Imai | H01L 33/60 257/99 |
| 2013/0016146 A1 | * | 1/2013 | Hashiguchi | B41J 2/14209 347/10 |
| 2013/0187190 A1 | * | 7/2013 | Muramatsu | H05K 13/00 257/99 |
| 2013/0335486 A1 | * | 12/2013 | Kobayashi | B41J 2/14209 347/68 |
| 2014/0043388 A1 | * | 2/2014 | Yoshimura | B41J 2/14209 347/16 |
| 2015/0256725 A1 | * | 9/2015 | Jiang | H04N 5/2253 348/373 |
| 2015/0353781 A1 | * | 12/2015 | Namiki | H01L 33/486 257/98 |
| 2016/0126495 A1 | * | 5/2016 | Oka | H01L 51/5246 257/40 |
| 2016/0133809 A1 | * | 5/2016 | Kuramoto | H01L 23/3135 438/27 |
| 2016/0218255 A1 | * | 7/2016 | Kim | H01L 33/504 |
| 2016/0254427 A1 | * | 9/2016 | Frei | H05K 3/341 257/88 |
| 2016/0332446 A1 | * | 11/2016 | Yuu | H01L 41/187 |

\* cited by examiner

LIGHT-EMITTING MODULE FOR VEHICLE LAMP

CROSS-REFERENCE TO RELATED APPLICATION

This application is a continuation application of and claims the priority benefit of U.S. application Ser. No. 16/571,187, filed on Sep. 15, 2019, now allowed, which is a continuation-in-part (CIP) application of and claims the priority benefit of U.S. application Ser. No. 15/175,113, filed on Jun. 7, 2016, now abandoned. The prior U.S. application Ser. No. 15/175,113 claims the priority benefit of Taiwan application serial no. 105201227, filed on Jan. 27, 2016. The entirety of each of the above-mentioned patent applications is hereby incorporated by reference herein and made a part of this specification.

BACKGROUND

Technical Field

The present invention relates to a light-emitting module, and more particularly to a light-emitting module for vehicle lamp, in which a light-emitting device may be precisely mounted onto and bonded with a circuit board.

Description of Related Art

Light-emitting diodes (LEDs) have numerous advantages such as long service life, small volume, low power consumption, and have been commonly used in displays or lighting devices. For example, LEDs are used as backlight sources of liquid crystal display (LCD) displays and cell phones or as part of vehicle lamps. Recently, light-emitting modules produced by mounting a plurality of LEDs on a substrate using Surface Mount Technology (SMT) have been continuously developed, and lighting devices (e.g. vehicle lamp devices) equipped with such light-emitting modules are being used more and more as main lighting sources of automobiles.

SMT is a technology that firstly prints a solder paste on a surface of a substrate and places various optical elements or electronic elements (such as LEDs, resistors, capacitors, chips) at corresponding positions where the solder paste was printed, and then the substrate with the plurality of elements is subjected to reflow soldering to cause the elements to be soldered to the substrate and electrically connected to the substrate. However, the following factors result in the displacement of the elements during the reflow soldering process: 1. tolerances of the elements themselves; 2. alignment tolerances between the elements; 3. mutual pulling forces between the elements and the solder paste generated when the solder paste is melting. Taking LED for example, the offset between a final position and a predetermined position of an LED often exceeds ±100 um (in which the effect of the reflow soldering process has not been considered). Thus, how to overcome the above shortcomings through the improvement in structural design and process technology has become one of the major issues to be solved in the art.

To make the aforementioned more comprehensible, several embodiments accompanied with drawings are described in detail as follows.

SUMMARY

A light-emitting module for vehicle lamp is provided. As embodied and broadly described herein, a light-emitting module for vehicle lamp is provided. The light-emitting module includes a circuit board comprising a device-attachment area, a conductive layer disposed on the device-attachment area, and light-emitting device, and an adhesive material having at least one point structure. The light-emitting device is disposed on the conductive layer and electrically connected to the circuit board through the conductive layer. The adhesive material is disposed at a portion of a periphery of the device-attachment area. The adhesive material exclusively contacts a lateral side and a bottom side of the light-emitting device and does not cover a top emitting surface of the light-emitting device, for connecting the light-emitting device to the circuit board without entirely surrounding the light-emitting device, and a curing temperature of the adhesive material is lower than a melting point of the conductive layer. Furthermore, the light-emitting device is mounted on the device-attachment area after the adhesive material is disposed on the circuit board.

In order to further understand the features and technical content of the present invention, reference is made to the following detailed description and accompanying drawings of the present disclosure. However, the description and accompanying drawings are for illustrative purposes only and is not intended to be a limitation on the scope of the present disclosure.

DESCRIPTION OF THE EMBODIMENTS

An embodiment of the present invention is mainly directed to structural improvements of a light-emitting module which can be applied to vehicle lamps. In the light-emitting module, each SMT element (e.g. SMT type LED element) is placed on a circuit board, and an adhesive material is disposed at the periphery of a configuration area of the SMT elements in advance, wherein the adhesive material has a curing temperature lower than the melting point of a conductive layer (e.g., the solder paste). After the adhesive material is disposed on the circuit board, the SMT elements are mounted on the circuit board such that the adhesive material is in contact with the SMT elements. With this design, the displacement of the SMT elements due to the melting solder paste during a reflow soldering process can be minimized, achieving the effect of precise positioning of the SMT elements.

Embodiments of a light-emitting module of the present invention are described below. Those skilled in the art can easily understand the advantages and effects of the present invention from the description disclosed herein. The present invention may be implemented as or applied in other different specific embodiments. All details in this description may also be modified or changed based on different ideas and applications without departing from the spirit of the present invention. In addition, the drawings of the present invention are only intended for illustration and are not drawn to scale, that is, actual dimensions of relevant components are not reflected. The following embodiments are used to further describe the technical contents of the present invention in detail and are not intended to limit the technical scope of the present invention in any way.

First Embodiment

Figure 1:
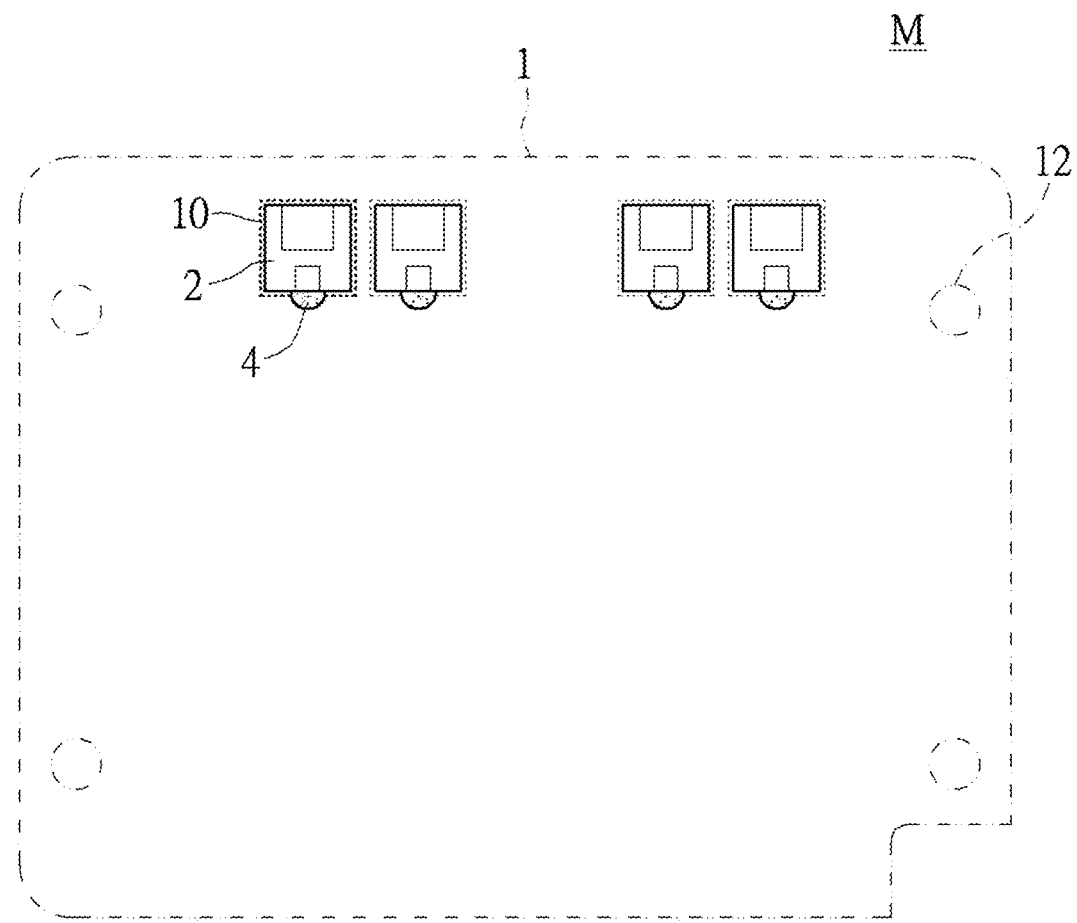
FIG. 1 is a plan view of a light-emitting module according to a first embodiment of the present invention.
Figure 2:
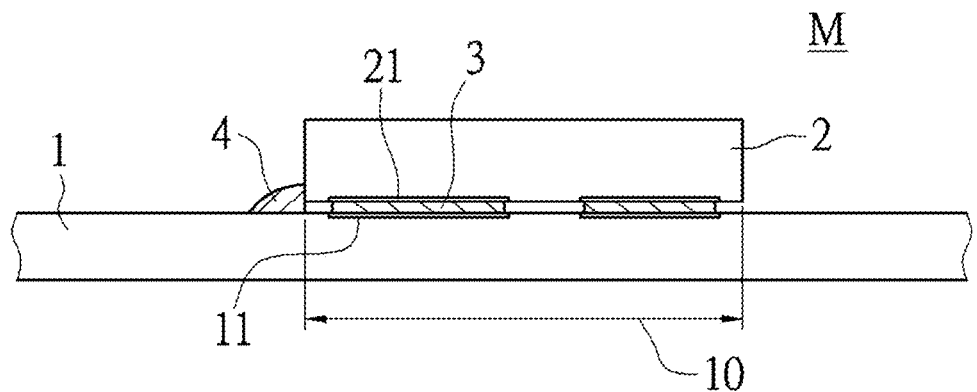
FIG. 2 is a cross-sectional view of an aspect of the light-emitting module according to the first embodiment of the present invention.
Figure 3:
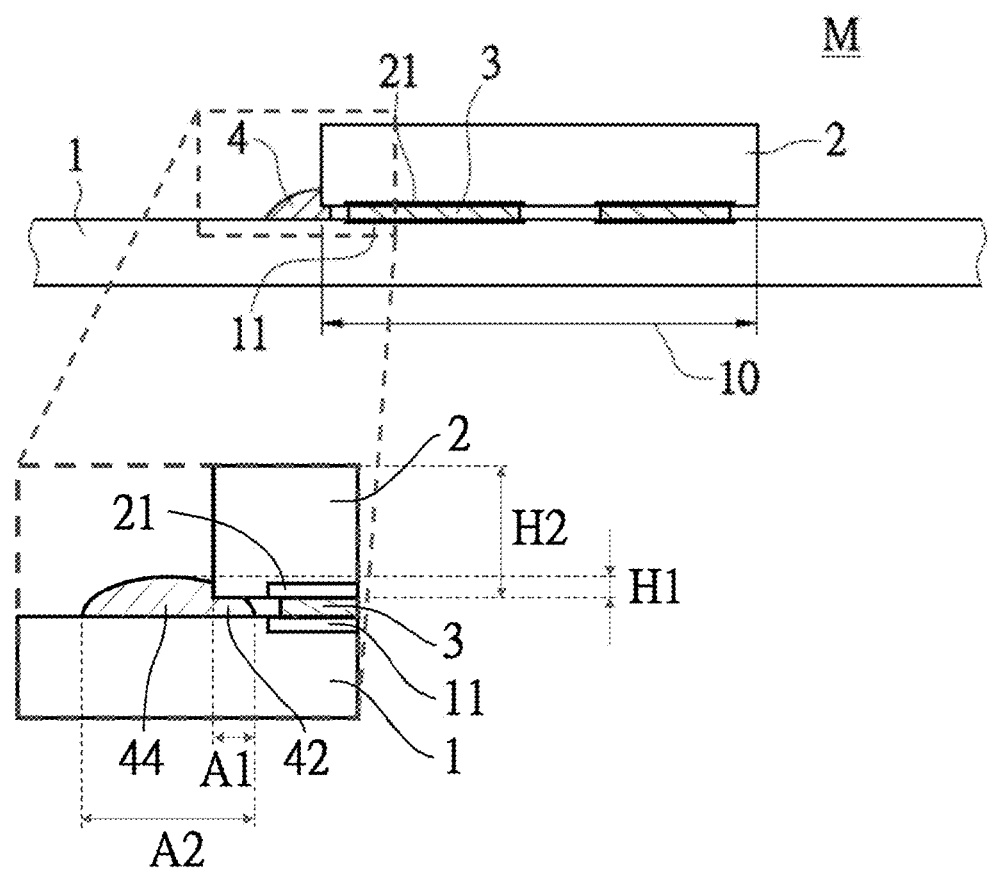
FIG. 3 is a cross-sectional view of another aspect of the light-emitting module according to the first embodiment of the present invention.
Figure 4:
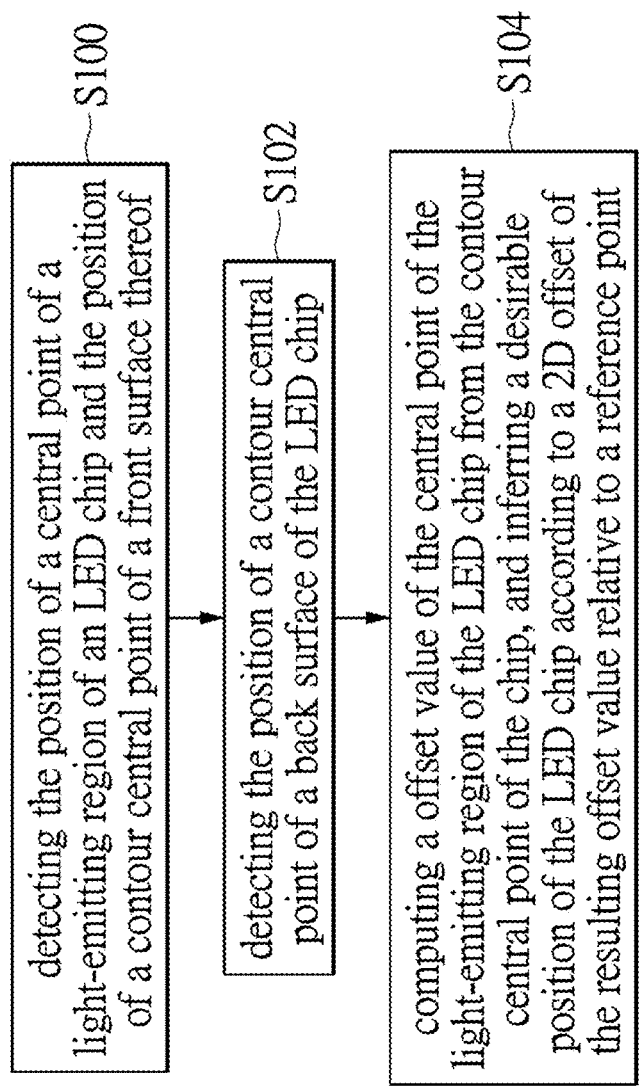
FIG. 4 is a flow diagram of a computing and positioning process according to the present invention.

Referring to FIG. 1 to FIG. 3, a light-emitting module M comprising a circuit board 1, a conductive layer 3, a light-emitting device 2, and an adhesive material 4 is provided. Structurally, the circuit board 1 comprises a device-attachment area 10 defined on an surface thereof, the conductive layer 3 is disposed on the device-attachment area of the circuit board 1, the light-emitting device 2 is disposed on the device-attachment area 10 of the circuit board 1 and electrically connected to the circuit board 1 through the conductive layer 3, the adhesive material 3 is configured to connect the light-emitting device 2 to the circuit board 1, wherein a curing temperature of the adhesive material 4 is lower than a melting point of the conductive layer 3. The conductive layer 3 is formed between the light-emitting device 2 and the circuit board 1, and the adhesive material 4 is formed on the periphery of a predetermined area of the light-emitting device 2 so as to fix or keep the relative position between the light-emitting device 2 and the device-attachment area 10 of the circuit board 1. For example, in some embodiments, the adhesive material 4 is in shape of a single droplet and is disposed only at one peripheral edge of the device-attachment area 10 of the circuit board 1. In the present embodiment, the circuit board 1 is an LED lamp board, and the circuit board 1 may be a fiberglass PCB, a metal core PCB (MCPCB), a ceramic circuit substrate or the like. The device-attachment area 10 of the circuit board 1 is configured to define a configuration area of the light-emitting device 2, and a plurality of PCB pads 11 spaced from each other are disposed in the device-attachment area 10. The positions of the PCB pads 11 are vertically corresponding to electrodes 21 of the light-emitting device 2 which is placed on the circuit board 1. The PCB pads 11 are electrically coupled to a control network (not shown) of the circuit board 1, and are also electrically coupled to the electrodes 21 of the light-emitting device 2 through the conductive layer 3 such that the light-emitting device 2 may be driven by driving signal transmitted from the circuit board 1 to emit light with predetermined light intensity.

In addition, according to a desired circuit layout, the circuit board 1 may further be configured with electronic components such as transformers, capacitors, resistors, inductors, diodes, integrated circuits (IC), or connectors, and these components may be mounted at suitable engagement positions on the circuit board 1.

The light-emitting device 2 is an SMT element; namely, the light-emitting device 2 is mounted on the device-attachment area 10 of the circuit board 1 using Surface Mount Technology (or SMT). In some embodiments, the process of placement of the light-emitting device 2 comprises: printing a conductive layer 3 onto the PCB pads 11 distributed within the device-attachment area 10 using a screen printer, placing the light-emitting device 2 onto the conductive layer 3 using a mounting apparatus, and then melting the conductive layer 3 by a soldering apparatus (e.g. air reflow soldering oven, nitrogen reflow soldering oven, vapor-phase vacuum soldering device) to cause the light-emitting device 2 to be soldered to the PCB pads 11. In some embodiments, the light-emitting device 2 include LED chip, LED chip package or the like.

In order to minimize the pulling effect exerted by the conductive layer 3 in a high-temperature molten state on the light-emitting device 2 resulting in the displacement of the light-emitting device 2 from a predetermined position, an embodiment of the present invention is: forming the at least one adhesive material 4 on at least one point at the periphery of the device-attachment area 10 to limit the offset of the light-emitting device 2. In some embodiments, the adhesive material 4 may be formed at two separated positions and in contact with the bottom edges of two adjacent sides of the light-emitting devices 2. In some other embodiments, the adhesive material may be formed at the bottom edges of the opposite sides of the light-emitting devices 2. In some alternative embodiments, the adhesive material 4 may be formed at four separated position and in contact with the bottom edges of all sides of the light-emitting device 2. In other words, the distribution of the adhesive material 4 (i.e. the number of positions where the adhesive material 4 is formed) is not limited in the present invention. In addition, a contact point between the adhesive material 4 and the light-emitting device 2 may be at any position at a bottom edge of a side of the light-emitting device 2, and the present invention is not limited thereto. For example, a portion of the adhesive material 4 may be in contact with a central position of a marginal region on a bottom surface of the light-emitting device 2, or a portion of the adhesive material 4 may be in contact with a lower center position on one of the lateral surfaces or side surfaces of the light-emitting device 2. Further, the position of the adhesive material 4 is not limited to be at the periphery of the device-attachment area 10; instead, the adhesive material 4 may also be formed between the light-emitting device 2 and the corresponding device-attachment area 10 according to the requirements of the manufacturing process or product. In addition, the adhesive material 4 may be substituted with an IR adhesive which may be fully cured by IR irradiation. However, the present invention is not limited to this example. This invention is to provide a light-emitting module where the light-emitting device 2 is positioned on the periphery of the corresponding device-attachment area 10 by the adhesive material 4 before reflow soldering is performed.

Although in the light-emitting module M as shown in FIG. 1, the adhesive material 4 is disposed at the periphery of the device-attachment area 10 for effectively fixing the light-emitting device 2 during reflow soldering, in other aspects of the present embodiment, through the adhesive property of the adhesive material 4, the same effect may also act on other SMT elements. That is to say, the relative position between the adhesive material 4 and the other components comprised in the light-emitting module M shown in FIG. 1 is provided for reference and illustration, and is not used to limit the present invention.

Further, in a preferred embodiment of the present invention, the adhesive material 4 is an adhesive droplet formed by using a thermosetting material supplying device, and the adhesive material 4 is slightly in contact with a central position on one bottom edge of one lateral side of the light-emitting device 2 such that with a limited volume, the adhesive material 4 can effectively limit the shift (drift) of the light-emitting device 2. The expression "slightly in contact with" mentioned herein means that when the adhesive material 4 is in a semi-cured, partially cured or fully cured state, a small portion of the adhesive material 4 is in contact with any position on the light-emitting device 2 (as shown in FIG. 2). Alternatively, when the adhesive material 4 is in a semi-cured, partially cured or fully cured state, a small portion of the adhesive material 4 is pressed by the light-emitting device 2 and located between the light-emitting device 2 and the circuit board 1 (as shown in FIG. 3). In some embodiments, the adhesive material 4 may include a first portion 42 formed inside a gap between the light-emitting device 2 and the circuit board 1 and a second portion 44 connected with the first portion 42 and formed outside the gap. For example, the first portion 42 of the adhesive material 4 is in contact with a central position of a marginal region on a bottom surface of the light-emitting device 2, and the second portion 44 of the adhesive material 4 is in contact with a lower center position on one of the lateral surfaces of the at least one light-emitting device 2.

In an embodiment where a single adhesive material 4 is applied to adhere the light-emitting device 2 mounted on the circuit board 1, the dimension and profile of the adhesive material 4 may be related to the bonding reliability between the light-emitting device 2 and the circuit board 1. To ensure that the light-emitting device can be stably adhered on the circuit board 1, in some embodiments, a first width between the circuit board 1 and the first portion 42 of the adhesive material 4 is about A1, a second width between the circuit board 1 and the adhesive material 4 is about A2, and a ratio of A1 to A2 may range from about 2.5% to about 50%. Preferably, the ratio of A1 to A2 may range from about 25% to about 50%. In the situation where the ratio of A1 to A2 ranges from about 2.5% to about 50% or from about 25% to about 50%, the first portion 42 of the adhesive material 4 is spaced apart from the conductive layer 3 such that shot circuit issue or other reliability issues may be prevented. The following table illustrates different A1 designs, and the ratio of A1 to A2 ranges from 25% to 50%.

|  | A2 (mm) | A1 (mm) | A1/A2 |
| --- | --- | --- | --- |
| Exp 1 | 0.9 | 0.4 | 44% |
| Exp 2 | 0.9 | 0.32 | 36% |

In an embodiment where a single adhesive material 4 is applied to adhere the light-emitting device 2 mounted on the circuit board 1, the dimension and profile of the adhesive material 4 may be related to the bonding reliability between the light-emitting device 2 and the circuit board 1. To ensure that the light-emitting device can be stably adhered on the circuit board 1, in some embodiments, a first width between the circuit board 1 and the first portion 42 of the adhesive material 4 is about A1, a second width between the circuit board 1 and the adhesive material 4 is about A2, and a ratio of A1 to A2 may range from about 2.5% to about 50%. Preferably, the ratio of A1 to A2 may range from about 25% to about 50%. In the situation where the ratio of A1 to A2 ranges from about 2.5% to about 50% or from about 25% to about 50%, the first portion 42 of the adhesive material 4 is spaced apart from the conductive layer 3 such that short circuit issue or other reliability issues may be prevented. The following table illustrates different A1 designs, and the ratio of A1 to A2 ranges from 25% to 50%.

|  | H1(um) | H2(um) | H1/H2 | Tilt Angle <3 degrees |
| --- | --- | --- | --- | --- |
| LED 1 | 154 | 840 | 18% | OK |
| LED 2 | 154 | 430 | 36% | OK |
| LED 3 | 154 | 750 | 21% | OK |

It is to be noted that a material having a curing temperature lower than the melting point of the conductive layer 3 may be selected to be the material of the adhesive material 4. Therefore, when a reflow soldering process is performed, the adhesive material 4 can effectively fix the relative position between the light-emitting device 2 and the circuit board 1 because a heat treatment at a first-stage temperature for thermally and fully curing the adhesive material 4 has been performed. During the reflow soldering process, the conductive layer 3 may melt at a second-stage temperature, i.e. the melting point of the conductive layer 3, causing the light-emitting device 2 to be soldered on the PCB pads 11 of the device-attachment area 10 after a heat treatment at the second-stage temperature. The second-stage temperature (i.e. the process temperature of the reflow process of the conductive layer 3) is higher than the first-stage temperature (the curing temperature of the adhesive material 4), and the adhesive material 4 will not be softened or melted again during the reflowing process of the conductive layer 3 or other further thermal treatments.

In the present embodiment, an epoxy adhesive may be selected to be the material of the adhesive material 4, and the first-stage temperature (i.e. curing temperature) corresponding to the epoxy adhesive may be between 90° C. and 150° C. In addition, a solder layer may be selected to be the conductive layer 3, and the second-stage temperature (i.e. the reflow temperature) corresponding to the solder layer may be between 217° C. and 230° C. The solder layer may be a tin-silver-copper alloy or a tin-gold alloy, but the present invention is not limited thereto. The adhesive material 4 can also be a non-conductive layer or a thermosetting adhesive layer; the present invention is not limited thereto. Specifically, any material which has a curing temperature lower than the melting point of the solder may be used to be the adhesive material 4, in which the adhesive material 4 will not be softened or melted again from heating after already being cured. In other words, the cured adhesive material 4 may not soften or melt again when being heated to the melting point of the conductive layer 3 (e.g., solder layer). For example, in other aspects of the present embodiment, a tin-gold alloy or a non-conductive adhesive may also be selected to be the adhesive material 4.

The fabrication process of the light-emitting module is illustrated below. The circuit board 1 including PCB pads 11 distributed in the device-attachment area 10 is provided. The conductive layer 3 is then formed on the PCB pads 11. After the conductive layer 3 is formed, the adhesive material 4 is formed on a predetermined region on the circuit board 1. In some embodiment, the adhesive material 4 is formed (e.g., dispensed) on a portion of the periphery of the device-attachment area 10. Then, the light-emitting device 2 is mounted on the device-attachment area 10 of the circuited board 1. The curing process is then performed so that the adhesive material 4 starts to harden when the first-stage temperature is arrived. The adhesive material 4 is fully cured to adhere the light-emitting device 2 and the circuited board 1, wherein only a lateral side and a bottom side of the light-emitting device 2 are adhered to the adhesive material 4. The adhesive material 4 may not cover a top light-emitting surface of the light-emitting device 2 in order to avoid to affect the light emitted from the top light-emitting surface of the light-emitting device 2. Accordingly, the light-emitting device 2 can be placed with accurate position on the device-attachment area 10 of the circuit board 1.

In some embodiments, the adhesive material 4 is formed on the circuit board 1 before the light-emitting device 2 is placed onto the circuit board 1. The distribution of the adhesive material 4 is not overlapped with the PCB pads on the circuit board 1 such that the adhesive material 4 may be spaced apart from the molten conductive layer 3, and solder contamination as well as bridge issue between PCB pads 11 resulted from the molten conductive layer 3 may be effectively prevented. In other words, a projection of the adhesive material 4 on the circuit board 1 does not overlap with the PCB pads 11. Since the adhesive material 4 is formed on the circuit board 1 before the light-emitting device 2 is placed onto the circuit board 1, the first portion 42 of the adhesive material 4 is covered and pressed by the light-emitting device 2 due to gravity, and the first portion 42 of the adhesive material 4 is thinner than the second portion 44 of the adhesive material 4.

After the light-emitting device 2 is placed onto the circuit board 1, a series of thermal treatments are performed. The above-mentioned thermal treatments include a curing process followed by a reflowing process, wherein the curing process is configured to cure the adhesive material 4 when the process temperature raises from room temperature to a curing temperature approximately between 90° C. to 150° C., and the reflowing process is configured to reflow the conductive layer 3 when the process temperature raises from the curing temperature to a reflow temperature approximately between 217° C. to 230° C. The temperature difference between the curing temperature of the adhesive material 4 and the melting point (i.e. reflow temperature) of the conductive layer 3 may range from 67° C. to 140° C. to make sure that the adhesive material 4 is cured and hardened when performing the reflow process. In some embodiments, the temperature difference between the curing temperature of the adhesive material 4 and the melting point (i.e. reflow temperature) of the conductive layer 3 is greater than 65° C. to make sure that the adhesive material 4 is cured and hardened before performing the reflow process even though the process temperature ramps rapidly.

Referring to FIG. 1 and FIG. 4 to FIG. 9, it is also to be noted that normally, tolerances are assigned to mechanical and electronic components such as the circuit board 1 and the light-emitting device 2, and in order to reduce or eliminate the tolerance of each light-emitting device 2 or the circuit board 1 itself and the alignment tolerance between the light-emitting device 2 and the circuit board 1 to achieve precise positioning of the light-emitting device 2 relative to the device-attachment area 10, the present invention adopts the following computing and positioning process: step S100, detecting the position of a central point 22 of a light-emitting region of the light-emitting device 2 and the position of a contour central point 23 of a front surface 20a thereof; step S102, detecting the position of a contour central point 24 of a back surface 20b of the light-emitting device 2; step S104, computing an offset value of the central point 22 of the light-emitting region of the light-emitting device 2 from the contour central point 23 of the front surface 20a of the light-emitting device 2, and inferring a desirable position of the light-emitting device 2 according to the resulting offset value and a 2D offset of the light-emitting device 2 relative to the contour central point 24 as a reference point.

Figure 5:
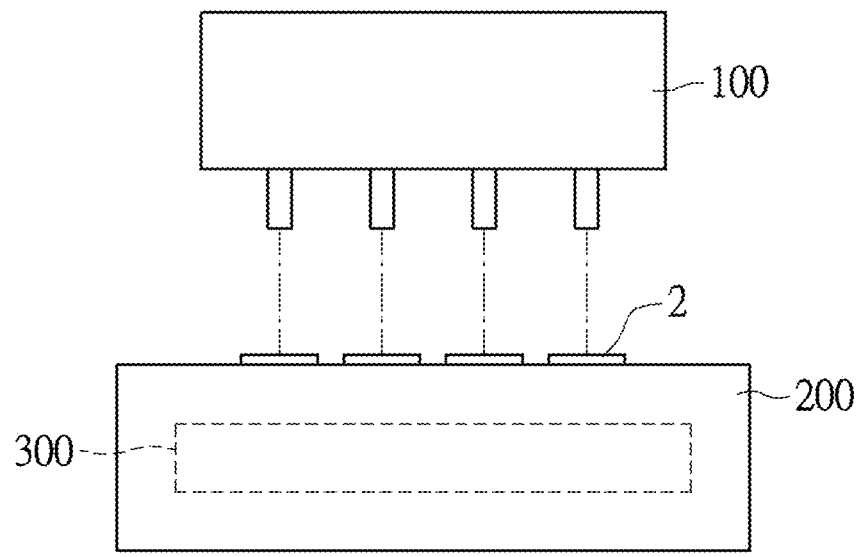
FIG. 5 is a schematic view (1) of steps of the computing and positioning process according to the present invention.
Figure 6:
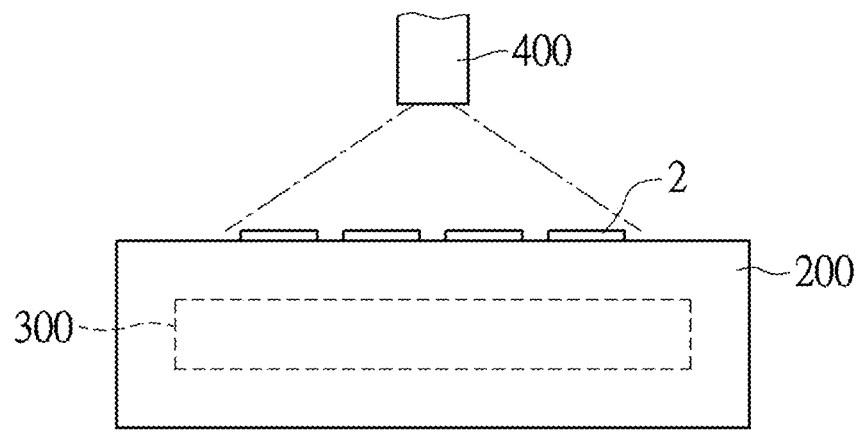
FIG. 6 is a schematic view (2) of steps of the computing and positioning process according to the present invention.
Figure 7:
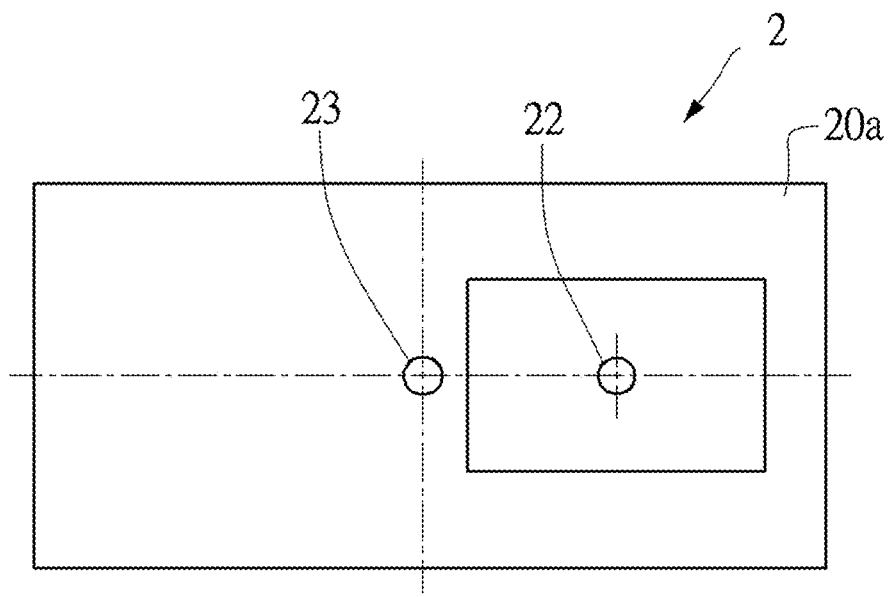
FIG. 7 is a schematic view of a front image of a light-emitting device taken by the computing and positioning process according to the present invention.

In implementing the step 100, as shown in FIG. 5 to FIG. 7, a plurality of light-emitting devices 2 are firstly transferred using a robotic arm 100 from a feeder to a bearing platform 200, wherein the bearing platform 200 is provided with at least one magnetic attraction or vacuum suction device and a light emitting device 300 for generating a magnetic force or vacuum suction force and providing an element backlight source so that the light-emitting devices 2 can be securely attached to the bearing platform 200; and then, a front image of the light-emitting devices 2 are acquired using an optical locating device 400 (e.g. CCD camera), and the position of a central point 22 of a light-emitting region of each light-emitting device 2 and the position of a contour central point 23 of a front surface 20a thereof are identified, the information of which is then converted into a first electrical signal to be transmitted to a processing unit.

Figure 8:
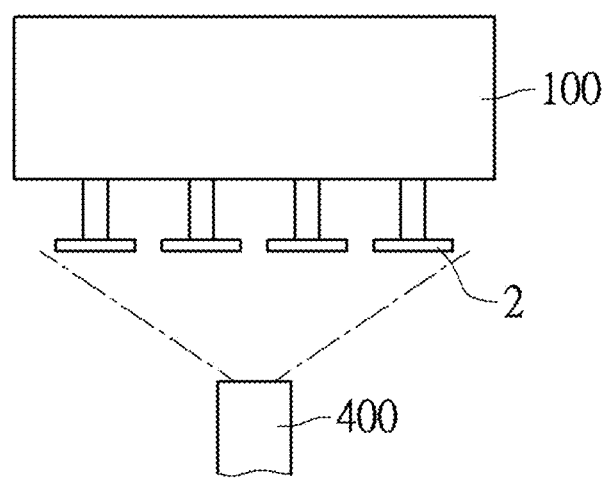
FIG. 8 is a schematic view (3) of steps of the computing and positioning process according to the present invention.
Figure 9:
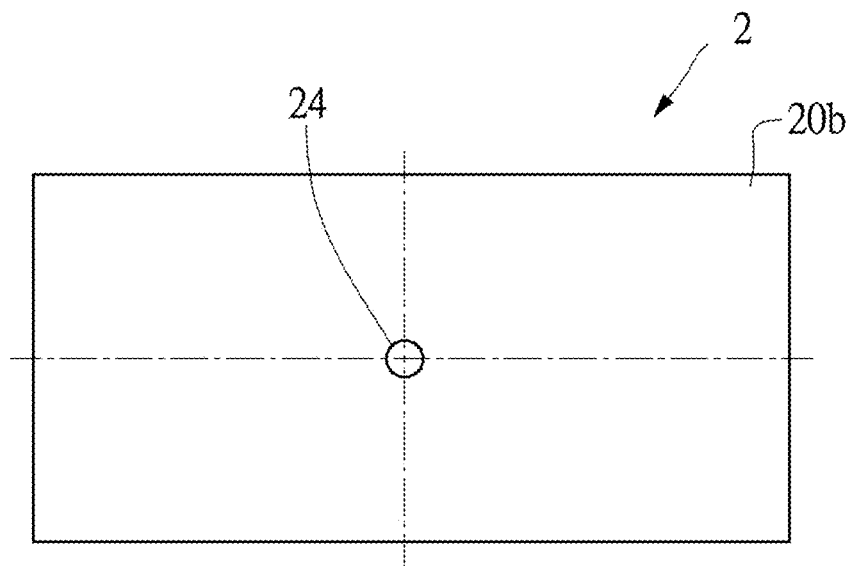
FIG. 9 is a schematic view of a back image of the light-emitting device taken by the computing and positioning process according to the present invention.

In implementing the step S102, as shown in FIG. 8, the light-emitting devices 2 are suctioned off the bearing platform 200 using the robotic arm 100, and then a back image of the light-emitting devices 2 is acquired using the optical locating device 400 (e.g. CCD camera), and then the position of a contour central point 24 of a back surface 20b of each light-emitting device 2 is identified, the information of which is then converted into a second electrical signal to be transmitted to the processing unit.

In implementing the step S104, the offset value of the central point of the light-emitting region of each light-emitting device 2 from the contour central point of the light-emitting device may be calculated by the processing unit according to the first and second electrical signals, and with positioning holes 12 of the circuit board 1 as reference points, the robotic arm 100 is controlled to accurately place the light-emitting devices 2 at desired positions on the circuit board 1 respectively. That is to say, as shown in FIG. 1, the positioning holes 12 are holes on the circuit board 1 passing therethrough and acting as reference points spatially corresponding to the device-attachment area 10.

Second Embodiment

Figure 10:
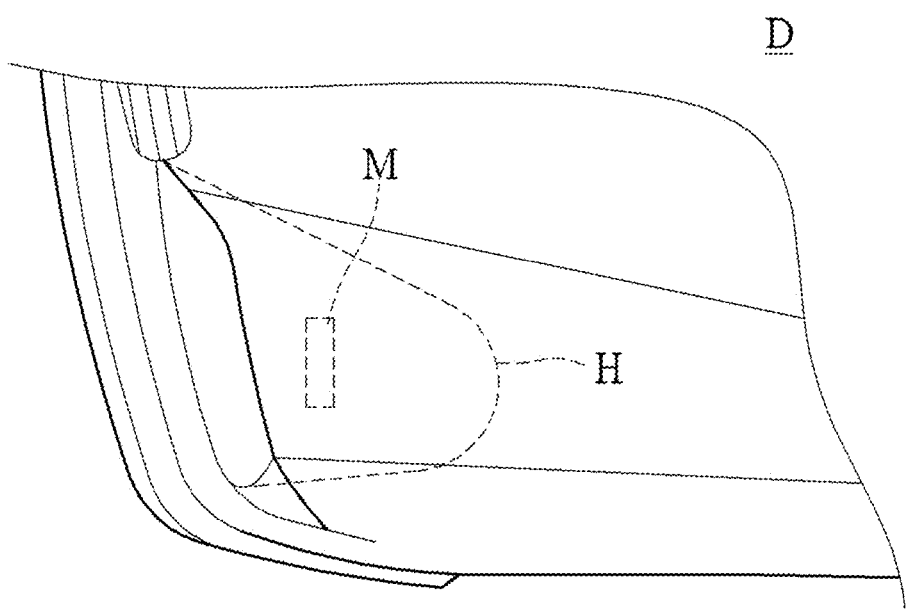
FIG. 10 is a schematic view of a vehicle lamp device according to a second embodiment of the present invention.

Referring to FIG. 1 and FIG. 10, a second embodiment of the present invention further provides a vehicle lamp device D (e.g. LED headlamp), mainly comprising a light-emitting module M and a vehicle lamp housing H, wherein the light-emitting module M is mounted in the vehicle lamp housing H. Please refer to the first embodiment for the details concerning the components of the light-emitting module M and the functionality thereof, which will not be described again hereinafter.

[Possible Effects of the Embodiments]

In the light-emitting module according to the embodiment of the present disclosure, through the design in which "the light-emitting device is disposed on the device-attachment area and is electrically connected to the circuit board through the conductive layer, and the adhesive layer is disposed on at least one point at the periphery of the device-attachment area and is in contact with the light-emitting device, wherein the curing temperature of the adhesive layer is lower than the melting point of the conductive layer" and "the light-emitting device is disposed on the device-attachment area and is electrically connected to the circuit board through the conductive layer, and the light-emitting device is accurately positioned using an adhesive layer before the light-emitting device is reflow soldered on the circuit board through the conductive layer." When the light-emitting device is reflow soldered, the displacement of the light-emitting device is restricted since the adhesive layer (various adhesives) can limit the shift of the light-emitting device, and also the adhesive layer (various adhesives) will not be softened or melted from being heated to the melting temperature of the conductive layer (i.e. the solder layer.) The precise positioning of the light-emitting device with an offset less than ±25 um can thereby be achieved. In sum, the vehicle lamp device using the light-emitting module provided in the embodiment of the present invention can meet the requirements of future LED headlamps for high-precision design, and thus the vehicle lamp device utilizing the light-emitting module of the present invention possesses enhanced competitive advantage in the market.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting module for vehicle lamp, comprising:
a circuit board comprising a device-attachment area;
a conductive layer disposed on the device-attachment area;
a light-emitting device disposed on the conductive layer and electrically connected to the circuit board through the conductive layer; and
an adhesive material in shape of a single droplet and disposed only at one peripheral edge of the device-attachment area, wherein the adhesive material exclusively contacts a lateral side and a bottom side of the light-emitting device and does not cover a top emitting surface of the light-emitting device, for connecting the light-emitting device to the circuit board without entirely surrounding the light-emitting device,
wherein the light-emitting device is placed on the circuit board after the adhesive material and the conductive layer are formed on the device-attachment area so as to fix relative positions between the light-emitting device and the device-attachment area of the circuit board,
wherein the adhesive material has a first portion and a second portion connected with the first portion, the first portion is formed inside a gap between the light-emitting device and the circuit board, and the second portion is formed outside the gap, wherein the first portion of the adhesive material is in contact with a central position of a marginal region on a bottom surface of the light-emitting device, the second portion of the adhesive material is in contact with a lower center position on one of the lateral surfaces of the light-emitting device, and the first portion of the adhesive material is spaced apart from the conductive layer.

2. The light-emitting module of claim 1, wherein the point structure of the adhesive material and the conductive layer have a predetermined spacing therebetween, and a maximum height of the adhesive material is slightly greater than a thickness of the conductive layer.

3. The light-emitting module of claim 1, wherein the circuit board includes a plurality of PCB pads in the device-attachment area, the light-emitting device includes a plurality of electrodes configured to be electrically coupled to the PCB pads, and a projection of the adhesive material on the circuit board does not overlap with the PCB pads.

4. The light-emitting module of claim 1, wherein a first width between the circuit board and the first portion of the adhesive material covered by the light-emitting device is A1, a second width between the circuit board and the adhesive material is A2, and a ratio of A1 to A2 ranges from 2.5% to 50%.

5. The light-emitting module of claim 4, wherein the ratio of A1 to A2 ranges from about 25% to about 50%.

6. The light-emitting module of claim 1, wherein a level height difference between the bottom surface of the light-emitting device and a top of the second portion of the adhesive material uncovered by the light-emitting device is H1, a thickness of the light-emitting device is H2, and a ratio of H1 to H2 ranges from 15% to 50%.

7. The light-emitting module of claim 1, wherein a curing temperature of the adhesive material is lower than a melting point of the conductive layer.

8. The light-emitting module of claim 1, wherein the circuit board includes a plurality of PCB pads, and a projection of the adhesive material on the circuit board does not overlap with the PCB pads.

9. The light-emitting module of claim 1, wherein the light-emitting device is a SMT-LED.

* * * * *